United States Patent [19]

Takagi

[11] 4,374,162
[45] * Feb. 15, 1983

[54] THIN-FILM DEPOSITION

[75] Inventor: Toshinori Takagi, Nagaokakyo, Japan

[73] Assignee: Futaba Denshi Kogyo Kabushiki Kaisha, Chiba, Japan

[*] Notice: The portion of the term of this patent subsequent to Oct. 14, 1997, has been disclaimed.

[21] Appl. No.: 140,596

[22] Filed: Apr. 15, 1980

Related U.S. Application Data

[63] Continuation of Ser. No. 705,512, Jul. 14, 1976, abandoned.

[30] Foreign Application Priority Data

Jul. 15, 1975 [JP] Japan ................. 50-86974

[51] Int. Cl.³ ............................................ C23C 13/00
[52] U.S. Cl. .................... 427/248.1; 427/42; 427/45.1; 427/50; 427/124; 427/250; 427/294; 427/295; 427/296; 427/421; 427/422

[58] Field of Search ................ 427/50, 294, 124, 251, 427/250, 421, 248.1, 38, 42, 45.1, 91, 295, 296, 422; 156/610-614, 608, DIG. 102, DIG. 64, DIG. 71, 600, 602, 35, 84, 86, 42, 255; 148/175; 118/49; 264/81; 214/175; 204/192 R

[56] References Cited

U.S. PATENT DOCUMENTS

| 2,074,281 | 3/1937 | Sommer | 427/251 |
| 2,242,101 | 5/1941 | Allee | 427/250 |
| 2,273,941 | 2/1942 | Dorn | 427/124 |
| 2,440,135 | 4/1948 | Alexander | 427/248.1 |
| 3,352,713 | 11/1967 | Schoffer et al. | 427/124 |
| 4,227,961 | 10/1980 | Takagi | 427/38 |

Primary Examiner—Michael R. Lusignan
Assistant Examiner—Janyce A. Bell
Attorney, Agent, or Firm—Birch, Stewart, Kolasch & Birch

[57] ABSTRACT

A material is introduced into and heated within a crucible of the sealed type for vaporization purposes and the crucible includes an ejection nozzle. The vapor of the material is then ejected through the nozzle into a vacuum region to strike onto a substrate, the pressure of the vacuum region being selected to be at least 1/100 times as low as the vapor pressure within the crucible and of approximately $10^{-2}$ Torr or less. Change in ejection velocity provide control of fine structures of films when being deposited on the substrate.

6 Claims, 2 Drawing Figures

THIN-FILM DEPOSITION

This application is a continuation of copending application Ser. No. 705,512, filed on July 14, 1976, now abandoned.

BACKGROUND OF THE INVENTION

The present invention relates to a film deposition technique which is applicable to the single-layer or multi-layer formation of thin-films of various elements or compositions on substrates of metals, semiconductors or insulators.

Pursuant to conventional prior art physical vapor deposition, a crucible having an opened end is provided within a high vacuum region or low gas pressure region. A material to be vaporized is supplied into and heated within the crucible and the generated vapor of the material is deposited onto a substrate.

Nevertheless, during the heating of the crucible, the vapor pressure corresponding to the particular heating temperature diffuses through the opened end of the crucible at one time such that the degree of vacuum of the substrate containing region declines due to the vapor of the material within the crucible. In addition, many other difficulties are encountered, for example, blackening of deposited films and roughing of particles of the deposited films. Due to the boiling phenomenon occurring within the crucible, splashed material will disperse outside the crucible and will result in attachment onto the surface of the deposited films. Therefore, restrictions are placed on the heating temperature of the crucible depending upon the physical properties of the material received within the crucible.

Meantime, even when the crucible is heated to high temperatures while experiencing the difficulties mentioned above, the resulting thermal energy is extremely small from the viewpoint of the kinetic energy. That is to say, as will be clear from the formula $KT/e = T/1.16 \times 10^4$, conversion of the thermal energy corresponding to $T(°K.)$ into the kinetic energy shows that, for example, when heating the crucible up to 2300° K. the kinetic energy is only 0.2 eV. The merits due to the kinetic energy, therefore, are hardly expected by the conventional vacuum deposition technique.

SUMMARY OF THE INVENTION

Accordingly, it is an object of the present invention to provide an improvement in the thin-film deposition technique which overcome the disadvantages discussed above.

Pursuant to the concept of the present invention, a material is received and heated within a crucible of the sealed type for the purposes of vaporization. The resulting vapor of the material is ejected through an ejection nozzle in the crucible into a vacuum region which is maintained at least 1/100 times as low as the vapor pressure of the crucible and approximately $10^{-2}$ Torr or less. The vacuum region contains a substrate on which deposited films are formed. The fine structures of the deposited films are controlled in accordance with changes in the ejection velocity. In this manner, the formation of the thin-films will not be disturbed by the disadvantages set forth above even when the crucible is heated up to a considerably high temperature.

Other objects and further scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A better understanding of the invention may be had from a consideration of the following detailed description taken in conjunction with the accompanying drawings in which.

DETAILED DESCRIPTION OF THE INVENTION

Figure 1:
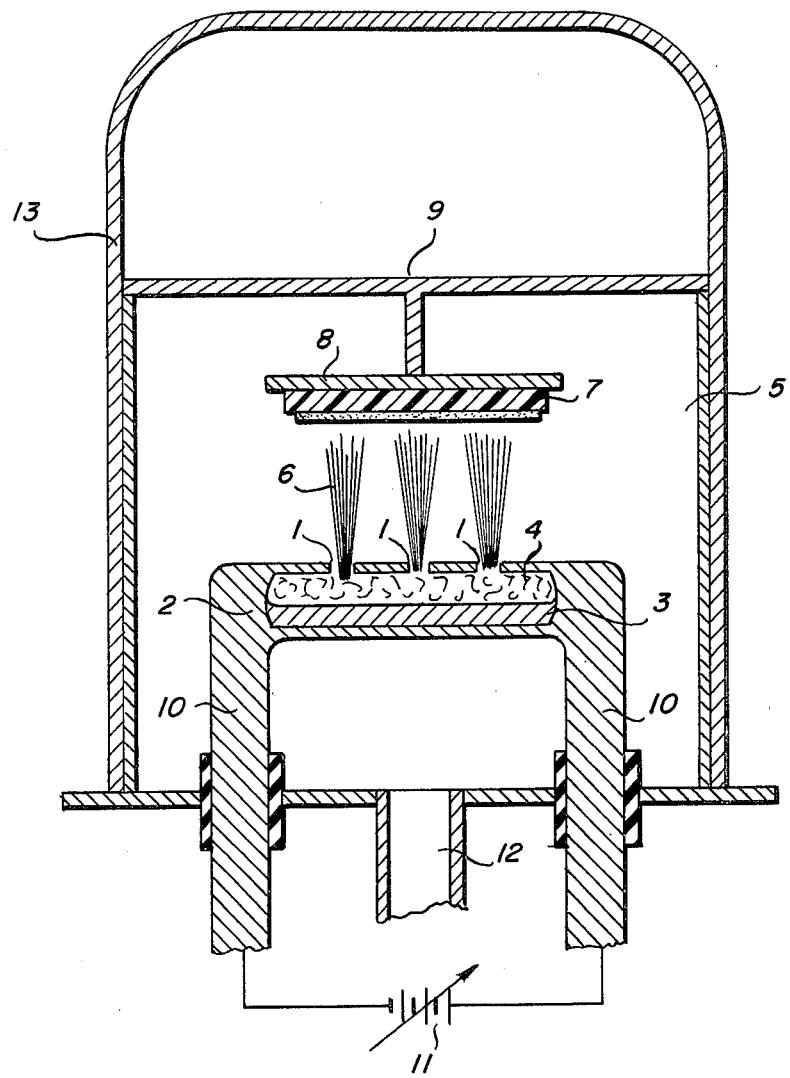
FIG. 1 is a cross-sectional view of one preferred form of an ion source embodying the present invention.

Referring now to FIG. 1, there is illustrated an ion source used with the film deposition technique of the present invention which includes a crucible 2 of the sealed type having a plurality of ejection nozzles 1 at its upper face. A material 3 to be vaporized is received within the crucible 2 and then the resulting vapor 4 of the material 3 is ejected via the ejection nozzles 1 into a vacuum region 5 as depicted by the character 6. The present invention includes a substrate 7 on which a desired thin-film is deposited by the thus ejected vapor 6, the substrate 7 is suspended from an upper wall 9 via a support 8. A couple of resistor rods 10 serve to heat the crucible 2 and also to support the same at both ends. A heating power supply 11 is connected between the resistor rods 10. The present ion source further includes an exhaust opening 12 and a bell jar 13.

The film deposition will be carried out with aid of the ion source set forth with respect to FIG. 1.

FIrst of all, the proper material 3 desired to be deposited is introduced into the sealed type crucible 2 having one or more ejection nozzles 1. The crucible 2 is heated by either the electron bombardment method, the high frequency method or the resistor method such that the material 3 within the crucible 2 is vaporized within the range of a vapor pressure of $10^{-1}$ to several Torr, or several tens Torr when the occasion may occur. The vapor 4 of the material 3 is ejected via the ejection nozzles 1 of the crucible 2 into the vacuum region 5 in which the pressure is approximately 1/100 times lower or less than the vapor pressure within the crucible and below about $10^{-2}$ Torr. At this time, atom aggregates or clusters consisting of atomic particles tied by van der Waals force are formed through a supercooled phenomenon due to the adiabatic expansion. The atom aggregate acquires the properties that atomic particles are easily separable but move in a group. Therefore, the atom aggregate will be broken up as soon as it strikes against the substrate. This contributes to the growth of the deposition due to the migration of depositing material particles.

In order to control the fine structures of the deposited films by utilization of the ejection velocity when the vapor of the material is ejected into the vacuum region, it is preferred that the vacuum region is maintained at a gas pressure of $10^{-4}$ Torr or less in a manner such that the material particles in the vapor phase emerging from the interior of the crucible 2 advance toward the substrate 7 without colliding with residual gas particles or the like in the substrate containing region. In other words the distance between the crucible 2 and the substrate 7 is shorter than the mean free path of the residual gas particles. Nevertheless, when tolerating such collisions to some extent or positively utilizing such collisions with the residual gas to some extent, selection of gas pressure lower than $10^{-2}$ Torr will give satisfactory results.

Because of the sealed type of the crucible 2, the boiling of the material 3 will not occur when the heating temperature of the crucible 2 is considerably high. Since the vapor 4 is ejected via the nozzles 1 to the exterior of the crucible (2) and thus the ejection nozzles 1 show high resistance, the vacuum region 5 where the substrate 7 is disposed may be kept in a high vacuum status of $10^{-6}$ to $10^{-4}$ Torr while the interior of the crucible 2 is being kept at a vapor pressure of several Torr. It is to be understood that the greater the difference between the internal and external pressures of the crucible 2 the greater the ejection velocity. The vapor 4 of the material having a high vapor pressure within the crucible 2 stands at thermal equilibrium status in which the constitutional atoms within the vapor 4 move in all directions. When these constitutional atoms are ejected from the nozzles 1, alignment of the movements of these constitutional atoms are effected in the ejecting direction. These atoms form the cluster in the course to the substrate 7. Analysis of the inventor's experimental results reveals that the cluster consisting of about 1000 atoms is very stable.

The velocity of the atoms being ejected from the ejection nozzles is given as follows:

$$V^2 = \frac{2\pi}{r-1} \cdot \frac{P_1}{\rho o} \left[ 1 - \left(\frac{P_2}{P_1}\right)^{\frac{r-1}{r}} \right]$$

wherein $\rho o$ is the vapor density within the crucible 2 and represented by the following formula:

$$\rho o = \frac{T_1}{Qev}\left(\frac{dP_s}{dT_1}\right)$$

wherein Qev is the heat of vaporization and Ps is the vapor pressure.

Therefore, the ejection velocity assumes about 400 eV under the following conditions: the material to be vaporized is Cu; the vapor pressure $P_1$ within the crucible 2 is 1 Torr; the temperature $T_1$ of the material receiving portion of the crucible 2 is 1890° K.; and the degree of vacuum $P_2$ in the vacuum region 5 outside the crucible 2 is $10^{-5}$ Torr. In this instance, the heat of vaporization Qev=72.8 Kcal/mol; $dP_s/dT_1 = 0.01$ Torr/deg.; and the number of the atoms forming a single cluster is 1000. The kinetic energy thus obtained during ejecting has an important effect upon the fine crystal structures of the deposited films and is controllable within a wide range by controlling the temperature of the crucible 2.

Figure 2A:
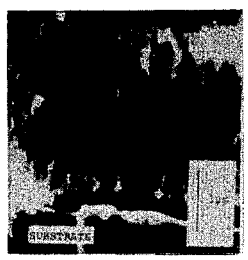
FIGS. 2(A), 2(B) and 2(C) are photographs showing surface conditions observed by scanning electron microscope wherein the section 2A illustrates surface morphology in case of conventional vacuum deposition, the section 2B illustrates surface morphology in case of thin-film deposition of the present invention, and the section 2C illustrates surface morphology of deposited films formed by ionizing clusters and accelerating the ionized clusters toward a substrate pursuant to the concept of the present invention.
Figure 2B:
Figure 2C:

Some examples of changes in the fine crystal structures of the deposited films in accordance with the velocity of ejection are illustrated in FIGS. 2A, 2B and 2C wherein there are shown the cross sections of Cu deposited films on polyimide substrate observed by a scanning electron microscope.

The section 2A depicts surface morphology in the case of conventional vacuum deposition and the section 2B depicts the same in the case of the preferred form of the film deposition of the present invention set forth with respect to FIG. 1. The section 2C illustrates surface morphology of the deposited films in accordance with another preferred form of the film deposition of the present invention. The surface morphology shown in section 2C is obtained by use of the sequential steps set forth with reference to FIG. 1, with the addition of ionizing the cluster and accelerating the ionized cluster in response to a negative acceleration voltage of approximately 5 KV. As viewed from FIGS. 2A, 2B and 2C, whereas in the conventional vacuum deposition the fine structure exhibits a so-called domed morphology, the morphology of the cluster state deposition closely resembles that obtained from the accelerated ionized-cluster state deposition with an acceleration voltage of 5 KV, with an accompanying strong preferred orientation.

It should be understood that the thin-film deposition of the present invention is applicable to not only the formation of thin-films of elemental materials such as Cu and Si but may also be used to form thin-films of compound materials. That is to say, constitutional elements of compound materials are present as a mixture within the region of the vapor 4 of the high vapor pressure in the crucible 2, they exhibit an isotropic nature, and form the clusters while they are ejected via the ejection nozzles 1. They are broken up to take again the form of individual atoms as soon as they strike against the substrate 7. Fine quality thin-films of the compound materials are obtainable due to the so-called migration contributive to crystal growth. In this case, the compound materials may be supplied to the crucible 2 by mixing the constitutional elements with the respective vapor pressures instead of supplying the materials in a compound phase.

As noted earlier, in accordance with the thin-film deposition technique of the present invention, the substrate containing region can be kept at a high vacuum status to thereby attain an improvement in the quality of the deposited films. In addition, the film deposition of the present invention can utilize the kinetic energy without the ionization procedure and control fine crystal structures of the deposited films by changes in the ejection velocity and hence the kinetic energy. The changes in the ejection velocity is accomplished by properly controlling the heating temperature of the crucible. The present invention, of course, is applicable to the formation of compound thin-films and also a multi-layer structure.

While a certain representative embodiment and details have been shown for the purpose of illustrating the invention, it will be apparent to those skilled in this art that various changes and modifications may be made without departing from the spirit or scope of the invention, and all such modifications as would be obvious to one skilled in the art are intended to be included within the scope of the following claims.

I claim:

1. A film deposition method comprising the steps of:
   heating and vaporizing a material within a crucible of the sealed type having one or more ejection nozzles;
   ejecting the resulting vapor of the material via the ejection nozzles to a vacuum region such that atom aggregates or clusters tied by van der Waals force are formed through an adiabatic expansion to attain a supercooled state, the vacuum region adapted to accommodate a substrate therein;
   maintaining a vapor pressure in the vacuum region such that vapor particles of the material advance toward the substrate without collision with residual gas particles or the like within the vacuum region;
   depositing said clusters of atomic particles on said substrate, wherein said clusters are broken up upon striking the substrate which contributes to growth of the deposition due to migration of the material particles; and
   controlling the ejection velocity by varying the heating temperature of said crucible and varying the pressure differential between the pressure in said crucible and the pressure in said vacuum region for the purpose of controlling fine structures of films deposited onto the substrate wherein kinetic energy obtained during the ejection step, which has an important effect upon the fine structures of the deposited films, is controllable within a wide range.

2. A film deposition method comprising the steps of:
   heating and vaporizing a material within a crucible of the sealed type having at least one ejection nozzle;
   ejecting the resulting vapor of the material through an adiabatic expansion to attain a supercooled state via the ejection nozzle into a vacuum region where a substrate is disposed to thereby strike against the substrate;
   forming clusters of atomic particles from the adiabatically expanded vapor in the supercooled state being tied by van der Waals force as they are ejected into the vacuum region;
   maintaining the vacuum region at a vapor pressure less than 1/100 times lower than the vapor pressure of the crucible, the vapor pressure in the vacuum region being approximately $10^{-2}$ Torr or less;
   depositing said clusters of atomic particles on said substrate, wherein said clusters are broken up upon striking the substrate which contributes to growth of the deposition due to migration of the material particles; and
   controlling the ejection velocity for controlling fine structures of the deposited films of the material onto the substrate.

3. A film deposition method as set forth in claim 2 wherein the controlling of the ejection velocity is accomplished by controlling the heating temperature of the crucible.

4. A film deposition method as set forth in claim 2 and further including the step of maintaining a vapor pressure within the crucible in a range of approximately $10^{-1}$ to several Torr.

5. A film deposition method as set forth in claim 2 further comprising the steps of:
   ionizing the clusters as they approach the substrate; and
   accelerating the ionized clusters by a supply of acceleration voltage.

6. A film deposition method comprising the steps of:
   heating and vaporizing a material within a crucible of the sealed type having at least one ejection nozzle;
   ejecting the resulting vapor of the material through an adiabatic expansion to attain a supercooled state via the ejection nozzle into a vacuum region where a substrate is disposed to thereby strike against the substrate;
   forming clusters of atomic particles from the adiabatically expanded vapor in the supercooled state being tied by van der Waals force as they are ejected into the vacuum region;
   maintaining the vacuum region at approximately a vapor pressure less than 1/100 times lower than the vapor pressure of the crucible, the vapor pressure in the vacuum region being approximately $10^{-2}$ Torr or less;
   maintaining a vapor pressure within the crucible in a range of approximately $10^{-1}$ to several Torr;
   depositing said clusters of atomic particles on said substrate, wherein said clusters are broken up upon striking the substrate which contributes to growth of the deposition due to migration of the material particles; and
   controlling the ejection velocity by varying the heating temperature of said crucible and varying the pressure differential between the pressure in said crucible and the pressure in said vacuum region for controlling fine structures of the deposited films of the material onto the substrate.

* * * * *